US006755983B2

(12) United States Patent  (10) Patent No.: US 6,755,983 B2
Yudasaka  (45) Date of Patent: Jun. 29, 2004

(54) THIN FILM FORMATION METHOD, DISPLAY, AND COLOR FILTER

(75) Inventor: Ichio Yudasaka, Suwa (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 10/247,583

(22) Filed: Sep. 20, 2002

(65) Prior Publication Data

US 2003/0076608 A1 Apr. 24, 2003

Related U.S. Application Data

(62) Division of application No. 09/424,044, filed as application No. PCT/JP99/01289 on Mar. 16, 1999, now Pat. No. 6,476,988.

(30) Foreign Application Priority Data

Mar. 18, 1998 (JP) .............................. 10-69146

(51) Int. Cl.$^7$ .............................. H05B 33/10
(52) U.S. Cl. .............................. 216/5; 216/11; 216/24; 216/67; 427/470; 427/535; 345/33; 345/55; 428/117; 428/141; 428/320.2
(58) Field of Search ................................ 216/5, 11, 24, 216/67; 156/71, 99, 245, 272.6; 313/512; 345/33, 55; 359/892; 427/470, 535; 428/117, 141, 320.2

(56) References Cited

U.S. PATENT DOCUMENTS

| 4,977,347 A | 12/1990 | Itou et al. ............... 313/112 X |
| 5,218,268 A | 6/1993 | Matsuda et al. ......... 313/112 X |
| 5,360,630 A | * 11/1994 | Thomas et al. ................ 427/64 |
| 5,435,887 A | * 7/1995 | Rothschild et al. ............ 216/26 |
| 5,559,397 A | 9/1996 | Tsuruka et al. .......... 313/112 X |
| 5,914,558 A | 6/1999 | Kusonoki et al. ....... 313/112 X |

FOREIGN PATENT DOCUMENTS

| EP | 0 823 644 A3 | 2/1998 |
| EP | 0 823 644 A2 | 2/1998 |
| EP | 0 989 778 A1 | 3/2000 |
| JP | A-5-347188 | 12/1993 |
| JP | A-7-24314 | 1/1995 |
| JP | A-9-127327 | 5/1997 |
| JP | A-9-203803 | 8/1997 |
| JP | A-9-230129 | 9/1997 |
| JP | A-9-258208 | 10/1997 |
| JP | A-10-153967 | 6/1998 |
| WO | WO 99/48339 | 9/1999 |

OTHER PUBLICATIONS

T.R. Hebner et al., Ink–Jet Printing of Doped Polymers for Organic Light Emitting Devices, Applied Phsycis Lettes, vol. 72, No. 5, Feb. 1998, pp. 519–521.

Y. Nonaka et al., Development of Color Filters by Pigment Ink Jet Printing (I), International Display Research Conference, 1999 pp. 238–241.

* cited by examiner

*Primary Examiner*—Alllan Olsen
(74) *Attorney, Agent, or Firm*—Oliff & Berridge, PLC

(57) ABSTRACT

A thin film formation method in accordance with the present invention forms banks (110) where affinity bank layers and non-affinity bank layers are alternately layered by repeating a step of forming an affinity bank layer (111–11$n$) with a material having affinity for a thin film material solution (130) (such inorganic material as $SiO_2$) and a step of forming a non-affinity bank layer (121–12$n$) with a material having non-affinity for the thin film material solution (130) (such organic material as resist) one or more times. Finally the thin film material solution (130) is filled between banks by an ink jet method, heat treatment is executed, and a thin film layer (131–13$n$) is sequentially layered. By these steps, cost required for affinity control can be decreased and forming multi-layer thin films with uniform film thickness becomes possible.

25 Claims, 8 Drawing Sheets

THIN FILM FORMATION METHOD, DISPLAY, AND COLOR FILTER

TECHNICAL FIELD

The present invention relates to a thin film formation technology suitable for manufacturing a display and a color filter having an EL (electroluminescence) device or an LED (light emitting diode), and more particularly to a technology advantageous for forming a multi-layer thin film layer between partition elements.

BACKGROUND ART

An ink jet method has been used to fill material, such as color resin, to organic semiconductor film of a display or to a color filter to manufacture liquid crystal panels for color display.

When material is filled by an ink jet method, it is necessary to form partition elements to partition pixel areas (hereafter also called "banks", a layer to form partition elements is called a "bank layer"), and to fill a thin film material solution to the area enclosed with the partition elements. A thin film material solution, which volume is much larger than the volume after film formation, is filled in the pixel area enclosed with the partition elements. Since a display is generally demanded to be slim, the height of the partition elements is limited. Therefore the behavior of the thin film material solution filled there differs depending on the wettability (affinity) which the partition elements and the area enclosed with the partition elements have for the thin film material solution.

If the partition elements have affinity for the material, the material easily flows over to the adjacent pixel areas, even if the partition elements exist, when an amount of material exceeding the height of the partition elements is filled, as shown in FIG. 9A. If the partition elements have no affinity for the material, the material does not flow over to the adjacent pixel areas due to the surface tension of the material, even if the amount of material exceeding the height of the partition materials is filled, as shown in FIG. 9B. If this material is heated to evaporate the solvent, thickness after film formation becomes thick at the center of the pixel area and thin at the edges, since the material is repelled by the side walls of the partition elements, as shown in FIG. 9C. This causes color unevenness and reduces reliability. Also if the partition elements are comprised of non-affinity elements, adhesion of the partition elements and ground plane of the partition elements is weak, which makes partition elements easily separate.

A prior art to solve such problems is a surface treatment technology to make the top of the partition elements have no affinity land to make the other portions have affinity. Japanese Patent Laid-open No. 9-203803 and Japanese Patent Laid-open No. 9-230129, for example, disclose a technology to process the top portion of the partition elements to be ink repellent by irradiating ultraviolet rays, and the area enclosed with the partition elements to have affinity for ink. For the former, an ink repellent (non-affinity) layer is coated at the top portion of the partition elements, and for the latter, the concave portion enclosed with the partition elements is made to have affinity for ink (affinity) by ultraviolet irradiation. Logical considerations of this technology are written in International Display Research Conference 1997, pp. 238–241. According to this technology, even if material is filled to the height exceeding the height of the partition elements, the material is repelled by the non-affinity film, and does not overflow to the adjacent pixel areas, as shown in FIG. 10A, since the side walls of the partition elements have affinity, and the thickness of formed film does not become thin at the edges of the pixel areas.

However, even in the above known technology, it is not clear how to set affinity of the side walls of the partition elements, therefore it is difficult to obtain a flat thin film layer. Japanese Patent Laid-open No. 9-230129 states that the degree of affinity is controlled by irradiating ultraviolet rays from both the front and back sides, but the degree of affinity and non-affinity, that is, how to set the respective contact angle to the thin film material solution, is not known.

If the non-affinity is too high, for example, the thin film layer becomes thin at the edges near the partition elements and thick at the center as shown in FIG. 9C. If affinity is too high, on the other hand, the thin film layer becomes thick at the edges near the partition elements and thin at the center as shown in FIG. 10B.

Also the above known technology assumes that there is only one thin film layer, therefore it is totally unknown how to treat the surface for forming a flat thin film layer for each layer when multi-layered thin film layers are formed. If the above known technology is applied for each layer, surface treatment is required each time a layer is formed, which requires numerous processing steps.

DISCLOSURE OF THE INVENTION

The present inventor discovered that if plasma treatment is performed using fluorine gas, the contact angle to ink is greatly different between an organic substance and an inorganic substance, depending on the mixing ratio of oxygen gas and fluorine gas. The present inventor also discovered that affinity can be controlled by forming banks where affinity material and non-affinity material are alternately layered and by executing plasma treatment.

It is accordingly a first object of the present invention to provide a thin film formation method which allows the formation of multi-layer thin films by laminating a bank using different materials.

A second object of the present invention is to control affinity without going through many processing steps for affinity control by managing surface treatment under predetermined conditions, so as to decrease the cost required for affinity control and to form multi-layer thin films having a uniform film thickness.

A third object of the present invention is to provide a display layered by the thin film formation method which can form multi-layer films. By this, image display without uneven brightness and color is implemented and reliability is improved.

A fourth object of the present invention is to provide a color filter layered by the thin film formation method which can form multi-layer films. By this, image display without uneven brightness and color is implemented.

To achieve the first object, the present invention is a thin film formation method for forming a thin film layer by filling a thin film material solution in areas enclosed with banks, comprising a step of forming the banks on a bank formation face, and a step of filling the thin film material solution in the banks. The step of forming the banks is for forming the banks where an affinity bank layer and a non-affinity bank layer are alternately layered by repeating the step of forming the affinity bank layer with an affinity material and a step of forming the non-affinity bank layer with a non-affinity material one or more times.

"Banks" here refer to partition elements which are formed to partition pixels of a display using a non-affinity semiconductor thin film device or to partition pixel areas of a color filter. For the layer structure of a bank, the type of non-affinity material or affinity material may be changed for each layer. The thickness of each layer to be layered may be changed for each layer. The bank formation face is a face where the banks are formed, and may be a drive board of a display or a transparent board of a color filter.

Affinity or non-affinity here is determined depending on the characteristics of the thin film material solution used to fill. If the thin film material solution has a hydrophilic property, for example, the surface having a polar group exhibits affinity, and the surface having a non-polar group exhibits non-affinity. If the thin film material solution has a lipophilic property, on the other hand, the surface having a polar group exhibits non-affinity, and the surface having a non-polar group exhibits affinity. The thin film material solution is selected in various ways depending on the manufacturing target. When the hydrophilic property or hydrophobic property of the thin film material solution changes at every layer, the layer structure is changed such that the bottom layer, of the two bank layers formed at positions corresponding to the thin film layer formed by the thin film material solution, exhibits non-affinity to the thin film material solution, and the top layer exhibits affinity. When the thin film material solution has a hydrophilic property, for example, an affinity material is an inorganic material and a non-affinity material is an organic material. When the thin film material solution has a hydrophobic property, an affinity material is an organic material and a non-affinity material is an inorganic material.

This involves, for example, a method for forming the above mentioned bank layer by coating materials. In other words, the step of forming the non-affinity bank layer and the step of forming the affinity bank layer are steps of forming respective bank layers by coating predetermined materials dissolved in solvent. And the non-affinity bank layer is formed by coating the material for the non-affinity bank layer before removing the solvent where the material of the affinity bank layer is dissolved.

To achieve the second object, the present invention further comprises a step of executing a predetermined surface treatment for the banks and bank formation faces after the above step of forming the banks. For the surface treatment, reduced pressure plasma treatment or atmospheric pressure plasma treatment is performed where the plasma gas is irradiated under a reduced pressure atmosphere or under atmospheric pressure using gas containing a fluorine or fluorine compound as the introductory gas. A prescribed condition is, for example, to execute plasma treatment in gas containing a fluorine compound and oxygen. Under this condition, a non-reactive group is generated on the surface of the inorganic material by plasma discharge, the non-reactive group is oxidized by oxygen, and a polar group, such as a carbonyl group or hydroxyl group, is generated. The polar group exhibits an affinity for fluid containing polar molecules, such as water, and exhibits non-affinity for fluid containing non-polar molecules. In parallel with the above reaction, a phenomenon where the fluorine compound molecules enter the organic material surface also occurs on the surface of the organic bank layer.

Particularly when the amount of fluorine compound is more than oxygen, that is, when the content of the fluorine compound to the total amount of fluorine compound and oxygen is set to 60% or more, for example, the surface is non-polarized by the mixing phenomenon of fluorine compound rather than by the influence of oxidation, since the mixing phenomenon of fluorine compound is more active than oxidation by oxygen in a gas atmosphere where the amount of fluorine compound exceeds oxygen. Therefore if plasma treatment is executed for an organic material under the condition where the amount of fluorine compound exceeds oxygen, the organic material exhibits a non-affinity for fluid containing polar molecules and exhibits an affinity for fluid containing non-polar molecules. For the gas containing fluorine, halogen gas, such as $CF_4$, $SF_6$ or $CHF_3$, is used. If a surface treatment is executed under this condition, the affinity of the surface of the non-affinity bank layer and the affinity bank layer is adjusted such that the difference between respective contact angles to the thin film material solution is greater. As a result, the surface is treated such that the contact angle of the surface of the affinity bank layer to the thin film material solution becomes 30 degrees or less, for example. And the surface is treated such that the contact angle of the non-affinity bank layer to the thin film material solution becomes 40 degrees or more, for example.

In the above mentioned surface treatment step, the surface treatment is executed under a predetermined condition where the non-affinity bank layer has a higher degree of non-affinity for the thin film material solution compared with the affinity material. Also in the surface treatment step, the surface treatment is executed under a predetermined condition where the affinity of the affinity bank layer for the thin film material solution is less than the affinity of the area enclosed with the banks for the thin film material solution.

In the above mentioned step of forming the banks, a set of an affinity bank layer and a non-affinity bank layer is formed by, for example, an affinity bank layer formation step of forming the affinity film with an affinity material, a non-affinity bank layer formation step of forming the non-affinity bank layer with a non-affinity material matching the bank formation area on the affinity bank layer, and a removal step of removing the affinity bank layer at the area where the non-affinity bank layer is not formed by etching using the non-affinity bank layer as a mask. Also in the step of forming the banks, a set of a affinity bank layer and a non-affinity bank layer is formed by a step of forming the affinity bank layer with an affinity material, a step of etching for etching the affinity bank layer matching the bank formation area in the bottom layer, a step of forming the non-affinity bank layer with a non-affinity material covering the affinity bank layer, and a step of etching the non-affinity bank layer matching the bank formation area in the top layer. It is also acceptable to collectively etch two or more sets of an affinity bank layer and a non-affinity bank layer after overlaying all or most of the affinity bank layers and non-affinity bank layers, rather than to perform etching to form a bank shape each time.

Here the non-affinity material is, for example, polyimide, amorphous silicon, polysilicon, an organic compound containing fluorine or an insulating organic compound (photosensitive material). The affinity material is such metal as Al and Ta, silicon oxide film or silicon nitride film.

Preferably in the thin film layers, the thin film layer at the lowest layer is set to roughly the same thickness as the affinity bank layer at the lowest layer of the bank. And each thin film layer layered on the lowest layer is set to a thickness roughly the same as the total of the respective thicknesses of the affinity bank layer and the non-affinity bank layer which are layered to a height corresponding to the banks. The contact shape of the wall faces of the banks and the liquid surface of the filled thin film material solution changes depending on the affinity of the wall faces. In the contact face with the affinity bank layer, the thickness of the thin film tends to increase since the thin film material solution contacts the wall face, and in the contact face with the non-affinity bank layer, the thickness of the thin film tends to decrease since the thin film material solution is repelled. The large amount of thin film material solution, which is filled, gradually decreases its volume by a heat treatment and other reasons, but if the layered structure is adjusted such that the liquid level of the thin film material solution comes to the boundary between the non-affinity bank layer and the affinity bank layer after heat treatment, then the characteristics of the non-affinity bank layer and the affinity bank layer are balanced, and the liquid level of the thin film material solution becomes vertical to the bank wall face, generally becoming flat. For example, the thickness of the non-affinity bank layer at the top layer is set to 500 nm or less, and the thickness of the other non-affinity bank layer is set to 100 nm or less.

To achieve the third object, the present invention is a display comprised of layered thin film layer formed by filling thin film material solution in an area enclosed with banks, characterized in that the bank is comprised of alternately layered affinity bank layers formed with a material having affinity for the above mentioned thin film material solution and non-affinity bank layers formed with a material having non-affinity for the above mentioned thin film material solution, pixel electrodes made of ITO, for example, are formed in the area enclosed with the above mentioned banks, and the above mentioned thin film layer is formed with an organic semiconductor material for forming a thin film light emitting element.

To achieve the fourth object, the present invention is a color filter comprised of layered thin film layers formed by filling a thin film material solution in areas enclosed with banks, characterized in that the bank is comprised of alternately layered affinity bank layers formed with a material having affinity for the above mentioned thin film material solution and non-affinity bank layers formed with a material having non-affinity for the above mentioned thin film material solution, a bank formation face is formed as a transparent board, the above mentioned banks are partition elements for partitioning the pixel areas, and the above mentioned thin film layer is formed with a color resin material for providing colors to the above mentioned pixels.

In the above mentioned display and color filter, the affinity bank layer and/or the non-affinity bank layer are surface-treated so as to have affinity or non-affinity respectively.

BEST MODE FOR CARRYING OUT THE INVENTION

Embodiments of the present invention will now be described with reference to the accompanying drawings.

(First Embodiment)

The first embodiment of the present invention concerns a thin film formation method using one of a plurality of types of layers constituting a bank as a mask for the other layers.

Figure 1:
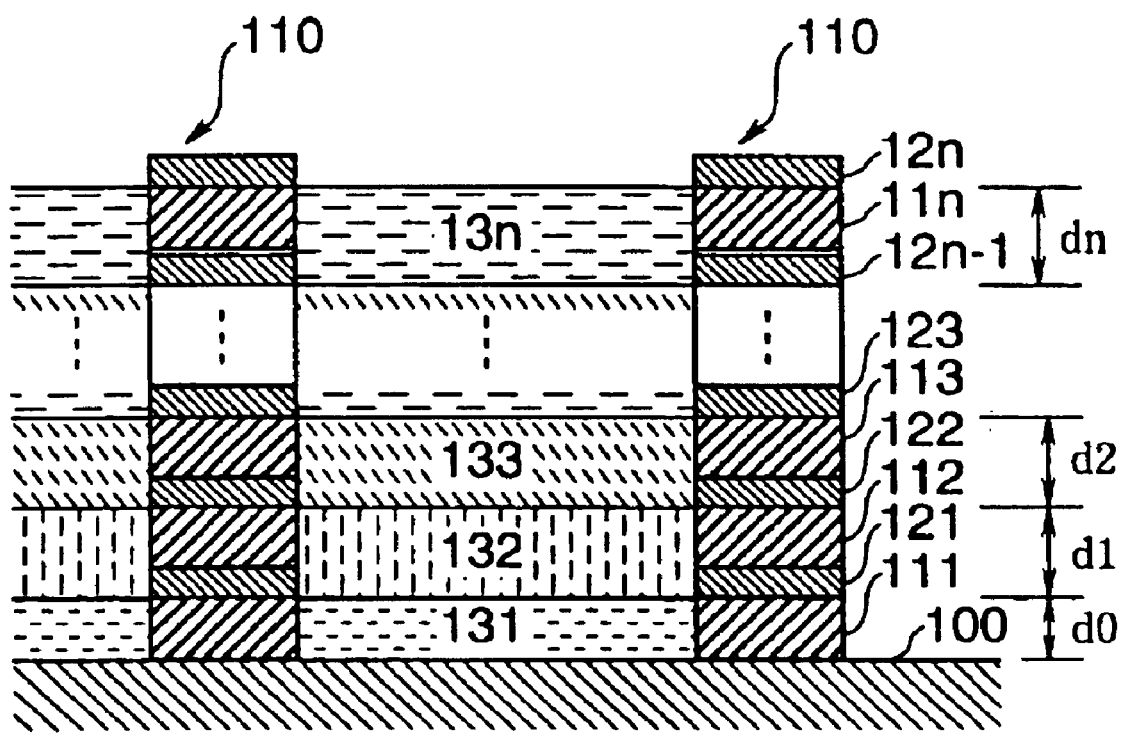
FIG. 1 is a cross-sectional view of a thin film layer structure in accordance with the first embodiment of the present invention.

FIG. 1 is a cross-sectional view of a thin film layer structure formed by the thin film formation method of the present invention. This layer structure can be used for various applications using. multi-layered thin films. For example, this layer structure can be used for an EL device, LED and color filter using organic semiconductor thin films. The layer structure in FIG. 1 is a structure when a hydrophilic thin film material solution is used. In the case of a hydrophilic thin film solution, affinity for surface-treated inorganic material is high, and affinity for organic material is low (non-affinity).

As FIG. 1 shows, this layer structure is configured by forming banks 110 on a bank formation face 100. The bank formation face may be a driving board where thin film transistors (TFT) used for a display are formed, or a transparent board used for a color filter. The structure of the bank formation face is not restricted as long as it is used for forming a thin film by filling fluid in areas enclosed by banks, which are partition elements. It is preferable that the bank formation face is made of a material which adheres to an affinity bank layer 111 forming the lowest layer of the bank 110. Particularly, it is preferable that the bank formation face is made of inorganic material in order to obtain appropriate affinity in the surface treatment to be executed later. The bank formation face is comprised of ITO, which is a transparent electrode, and silicon in the case of a display, and is comprised of glass or quartz in the case of a color filter, so as to maintain strong adhesion with the affinity bank layer.

The bank 110 is configured by alternately layered affinity bank layers 111–11$n$ (n is a natural number) and non-affinity bank layers 121–12$n$. The surfaces of the affinity bank layers 111–11$n$ are treated so as to have a predetermined affinity for the thin film material solution forming the thin film layers 131–13$n$ at positions corresponding to the layer. As a material of the affinity bank layers 111–11$n$, a material having good adhesion with the bank formation face 100 and the non-affinity bank layers 121–12$n$ is preferable, and the material may have any one of an insulating, semiconducting or conducting property. For example, such metal as Al and Ta, silicon oxide film ($SiO_2$) and silicon nitride film ($SiN_x$), which are generally used as insulation film, can be used as the affinity bank layers 111–11$n$. It is not necessary to use the same material for each affinity bank layer. Any material which has good affinity for the thin film material solution of the thin film layer 13$x$, which is formed corresponding to each affinity bank layer 11$x$ (x is an arbitrary natural number), can be used, and it is unnecessary to use the same material for all affinity bank layers.

The surfaces of the non-affinity bank layers 121–12n are treated so as to have non-affinity for the thin film material solution forming the thin film layers 131–13n at positions corresponding to the layer. As a material of the non-affinity bank layers 121–12n, a material having good adhesion with the affinity bank layers 111–11n is preferable, and the material may have any one of an insulating, semiconducting or conducting property. For example, such material as polyimide, amorphous silicon, polysilicon, an organic compound containing fluorine or insulating organic compound can be used as the non-affinity bank layers 121–12n. It is not necessary to use the same material for each non-affinity bank layer. Any material can be layered if affinity for the thin film material of the thin film layer 13x, which is formed corresponding to each affinity bank layer 11x (x is an arbitrary natural number), improves after surface treatment. For example, when this layer structure is applied to a color filter, the top layer 12n may be formed to be a black matrix so as to provide a shielding function. In order to form the top layer 12n as a shielding element, such metal as chrome, oxide or black resist material can be used.

The thickness of each bank layer is set as follows. If the lowest layer is the affinity bank layer 131, the thickness d0 of the affinity bank layer 131 is set to be roughly the same as the thickness of the thin film layer 131, which is formed corresponding to this layer. For the layers on the lowest layer, the thickness dx when the non-affinity bank layer 11x+1 and the affinity bank layer 12x are added is set to be roughly the same as the thickness of the thin film layer 13x+1, which is formed corresponding to these layers. The thickness of the thin film 132, for example, is roughly the same as the thickness d1, which is the total thickness of the non-affinity bank layer 121 and the affinity bank layer 112. The thickness of the thin film layer 13n is roughly the same as the thickness dn, which is the total thickness of the non-affinity bank layer 12n–1 and the affinity bank layer 11n. These settings are important to form a flat thin film layer.

The above layered structure is applied when the thin film material solution is comprised of molecules with a polar group. When the thin film material solution is comprised of molecules without a polar group, the material of the non-affinity bank layer and the material of the affinity bank layer are switched.

If each one of the thin film layers is formed with molecules with a polar group or molecules without a polar group depending on the layer, materials of two bank layers, which are at positions where each thin film material solution is filled, are selected such that the bottom layer has non-affinity for the thin film material solution and the top layer has affinity.

The thin film layers 131–13n are comprised of materials having characteristics which match the purpose of the respective layer. When this layered structure is applied to a display, for example, an arbitrary organic semiconductor thin film material solution is filled in each thin film layer. For each thin film layer, an organic semiconductor thin film material solution which emits primary colors is laminated for a plurality of layers, or material for a hole transporting layer or electron transporting layer is filled and layered according to necessity. When this layered structure is applied to a color filter, for example, resin with a different refractive index is filled and layered for each thin film layer. Such a layered thin film structure becomes an optical interference filter where only light with a specific wavelength is transmitted, which provides colors with good selectivity.

A black matrix may be applied to the top layer of the bank. In other words, chromium oxide or black resist is coated. This layer may be used as the non-affinity layer or may be formed independently from the non-affinity layer. The thickness of each thin film layer 131–13n is, as mentioned above, set roughly the same as the total thickness of the non-affinity bank layer and the affinity bank layer which are formed at positions corresponding to the thin film layer.

(Function of Layered Structure)

According to the above layered structure of the banks, equipment where thin film layers with uniform thickness are layered can be provided. When the banks 110 are manufactured in the above structure, the thin film layer becomes flat. In other words, when thin film material solution is filled, the contact shape of the liquid surface of the thin film material solution to the wall faces changes depending on the affinity of the wall faces of the bank. In the contact face with the affinity bank layer, the thickness of the thin film tends to increase, since the thin film material solution contacts the wall face, and in the contact face with the non-affinity bank layer, the thickness of the thin film tends to decrease since the thin film material solution is repelled. The large volume of thin film material solution which is filled, gradually decreases its volume by a heat treatment and other reasons, but if the layered structure is adjusted such that the liquid level of the thin film material solution comes to the boundary between the non-affinity bank layer and the affinity bank layer after heat treatment, then the characteristics of the non-affinity bank layer and the affinity bank layer are balanced, and the liquid level of the thin film material solution becomes vertical to the bank wall face, generally becoming flat.

Equipment using this layered structure exhibit a predetermined effect since the thin film layer is flat. If the thickness of each thin film layer is uniform, when a light emitting type display device is formed by flowing current between electrodes, the current density between the electrodes becomes constant, which improves the uniformity of light emission preventing a concentration of current at a specific location, therefore reliability improves. In the case of a device where voltage is applied between electrodes, an electric field is not applied on a thin area, therefore this layered structure improves reliability and extends life. Color and brightness also become uniform. When this layered structure is applied to a color filter, uniformity of colors improves and such problems as missing colors can be prevented.

(Manufacturing Method)

Now a thin film formation method for obtaining this layered structure will be described with reference to the cross-sectional views on manufacturing steps in FIG. 2 and FIG. 3.

Bank Formation Step (FIGS. 2A–D):

In the bank formation step, the affinity bank layers 111–11n and the non-affinity bank layers 121–12n are layered on the bank formation face 100 so as to form the banks 110.

Figure 2A:
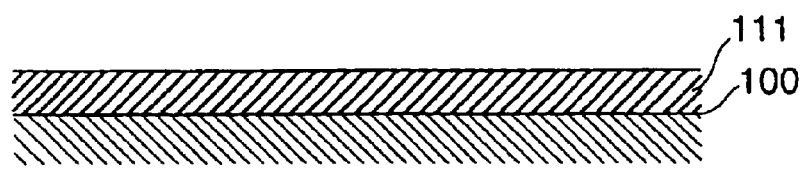
FIGS. 2A–2E are cross sectional views of manufacturing steps of a formation method in accordance with the first embodiment of the present invention.

At first, the affinity bank layer 111 is formed on the entire surface of the bank formation surface 100 (FIG. 2A). The formation methods, including the PECVD (Plasma Enhanced Chemical Vapor Deposition) method, the CVD (Chemical Vapor Deposition) method, evaporation method, sputtering method and various coating methods (spin coating, spray coating, roller coating, die coating and dip coating) are used depending on the material. For example, in this embodiment, $SiO_2$ film is formed using the spin coating method by SOG (Spin On Glass). The thickness of the affinity bank layer 111 at the lowest layer is matched with the thickness of the thin film layer 131.

Figure 2B:

Then the non-affinity layer 121 is formed matching the bank shape (FIG. 2B). To form the non-affinity bank layer, an organic material is formed on the entire surface by the above mentioned method. When a normal photolithography method is used, a mask is placed matching the bank shape, the resist is exposed, developed and removed, and the organic material in the portions which is not masked is removed by etching. When a printing method is used, the organic material is directly coated matching the bank shape by such a method as an intaglio, planographic or relief method. The thickness of the non-affinity bank layer 121 is a thickness where a function to repel the thin film material solution, which is filled in later, can be sufficiently exhibited. Adjustment, however, is necessary so that the total thickness of this layer and the next affinity bank layer 112 to be overlapped on this layer becomes roughly the same as the thin film layer 132.

Figure 2C:
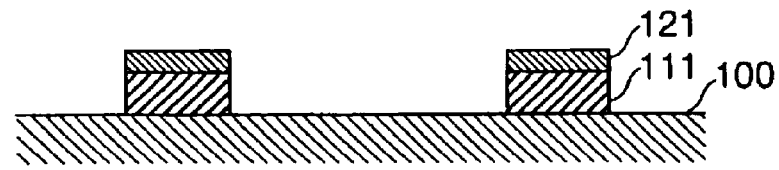

Then using the non-affinity bank layer 121 as a resist mask, the inorganic material film is etched (FIG. 2C). The non-affinity bank layer, which is an organic material, can function as a resist mask.

Figure 2D:
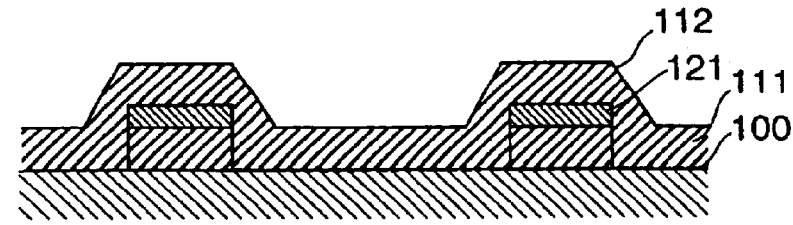

Next, just like in FIG. 2A, SOG, an inorganic material, is coated on the entire surface (FIG. 2D). The thickness of the inorganic material is a thickness where a function to contact with the thin film material solution, which is filled in later, can be sufficiently exhibited. Adjustment, however, is necessary so that the total thickness of this layer and the non-affinity bank layer 121 under this layer becomes roughly the same as the thin film layer 132. Hereafter, the bank is layered by repeating the steps in FIGS. 2B–D.

The top layer to be layered is the non-affinity bank layer 12n. This is because if the top layer does not have non-affinity, the filled thin film material solution will flow over the banks 110.

Figure 2E:
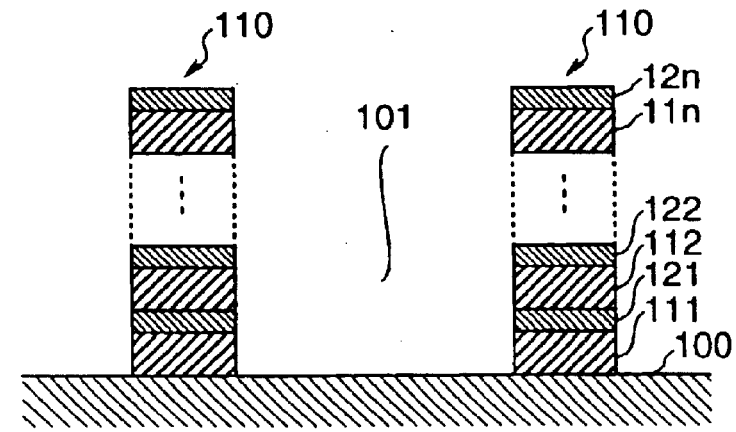
Figure 3A:
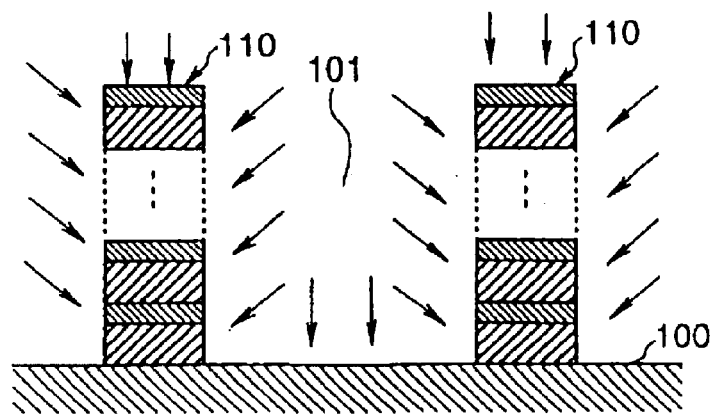
FIGS. 3A–3D are cross-sectional views of manufacturing steps of the thin film formation method in accordance with the first embodiment of the present invention.
Figure 3B:
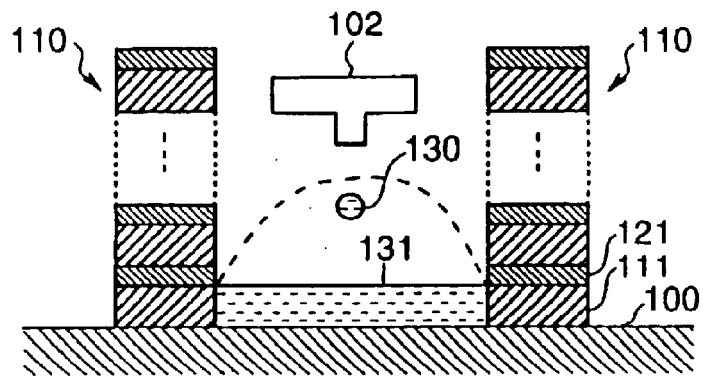

By the above steps, the structure comprised of the banks 110 and the concave portions 101 enclosed with the banks, as shown in FIG. 2E, is formed. By this structure, the banks with a multi-layered structure, where the affinity layer and the non-affinity layer are alternately layered, are formed. After these steps, the step to sequentially fill the thin film material solution in the concave portions 101, as shown in FIG. 3B, is executed. Here, surface treatment is executed to adjust the degree of affinity of the bank formation face 100 and each layer of the bank 110 for the thin film material solution.

Surface Treatment Step (FIG. 3A):

In the surface treatment step, the affinity of the bank formation face 100 and each layer of the bank 110 for the thin film material solution is adjusted by executing plasma treatment under predetermined conditions. In the plasma treatment of this invention, gas containing fluorine is used as the introductory gas. This plasma treatment may be reduced pressure plasma treatment under a reduced pressure atmosphere, or may be atmospheric pressure plasma treatment under atmospheric pressure. It is preferred that the reaction gas contains a predetermined amount of oxygen. For the fluorine compound, $CF_4$, $SF_6$, and such halogen gas as $CHF_3$ can be used.

Figure 4:
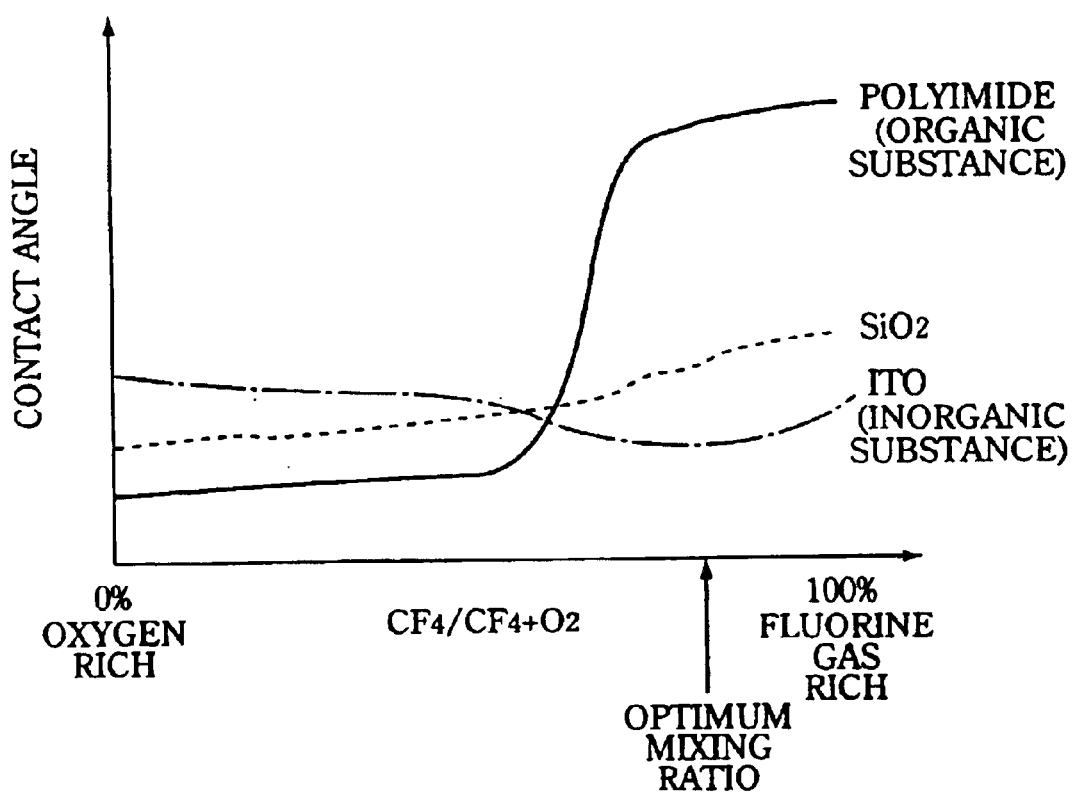
FIG. 4 is a graph depicting the relationship between the mixing ratio of fluorine and oxygen and the contact angle in accordance with the principle of surface treatment of the present invention.

Whether a surface becomes easy or difficult to wet by a fluid, such as thin film material solution, that is, whether the surface has affinity or non-affinity for the fluid, is known by measuring the contact angle of the surface to the fluid. FIG. 4 is a graph when changes of the contact angle were measured depending on the mixing ratio of fluorine compound and oxygen during plasma treatment for organic material and inorganic material. The contact angle is the contact angle to water-color ink (ink which can be diluted in water). This graph shows the case when $CF_4$ is used as the fluorine compound, polyimide as the organic material and $SiO_2$ and ITO (Indium-Tin-Oxide) as the inorganic material. Other materials will present a similar tendency depending on whether the material is organic or inorganic. As FIG. 4 shows, when oxygen exceeds the fluorine compound, the degree of the contact angle is not very different between the organic and inorganic materials. When fluorine compound exceeds oxygen, however, the contact angle of the organic material increases. (If the thin film material solution has affinity, the organic material exhibits non-affinity.) Whereas changes of the contact angle of an inorganic material are small. When oxygen is contained in the reaction gas, a polar group is generated in both inorganic and organic materials due to the oxidation function of oxygen. However, if the fluorine compound exceeds, fluorine compound molecules enter the organic material, which relatively decreases the influence of the polar group. Therefore, by executing plasma treatment while controlling fluorine compound so as to exceed oxygen, the surface of the banks 110 and the bank formation face 100 can be set to a desired contact angle (affinity), as shown in FIG. 4. In particular, using the optimum mixing ratio ($CF_4/CF_4+O_2=75\%-90\%$) is preferable to maximize the difference of the contact angle between the banks and the bank formation face. Critical is to set the difference of the contact angle between polyimide and SOG or ITO large, and to achieve this purpose, it is sufficient that $CF_4$ is approximately 70% or more. according to FIG. 4. For example, the surface of the affinity bank layer is treated such that the contact angle to the thin film material solution is 30 degrees or less. And the surface of the non-affinity bank layer is treated such that the contact angle to the thin film material solution is 40 degrees or more.

According to the above, in the present embodiment, a reduced pressure plasma treatment or atmospheric pressure plasma treatment is executed using fluorine compound as the introductory gas while mixing oxygen at a predetermined ratio. In the case of capacity coupling type plasma treatment, for example, the above gas is supplied to a reaction chamber, a board having the bank formation face 100 is placed on one electrode, and an electric field is applied from a power supply. To apply energy to the reaction chamber, various known methods can be used, including a direct current anodizing method, a high frequency method, inductive coupling, capacity coupling, a microwave method and a method applying both an electric field and magnetic field.

For example, when the bank formation face 100 (bottom face of the concave portion 101) is formed with such a transparent electrode as ITO, and the affinity bank layer with $SiO_2$, and the non-affinity bank layer with polyimide, the sequence of affinity for the thin film material solution 130 becomes bank formation>=affinity bank layer>non-affinity bank layer after the above surface treatment.

Thin film formation step (FIGS. 3B–D):
In the thin film formation step, the thin film material solution is sequentially filled in the concave portions 101 enclosed with the banks 101, to laminate the thin film layers.

For the thin film material solution 130 applied to a display, organic semiconductor material, materials where a hole supply element is doped as a hole transporting layer, or a material where an electron supply element is doped as an electron transporting layer, for example, are used. To apply the thin film material solution 130 to a color filter, color resin, for example, is used.

Figure 3C:
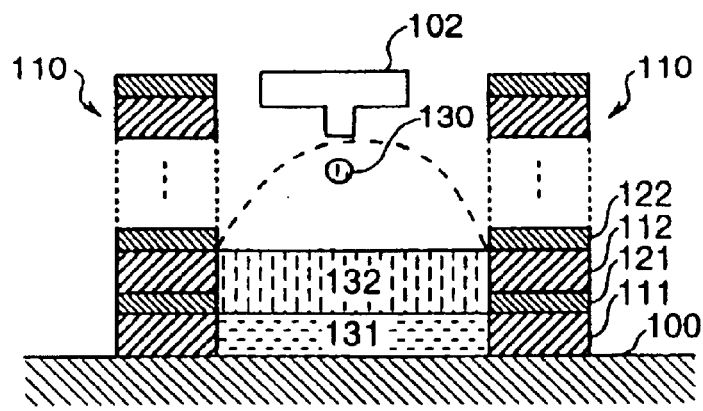
Figure 3D:
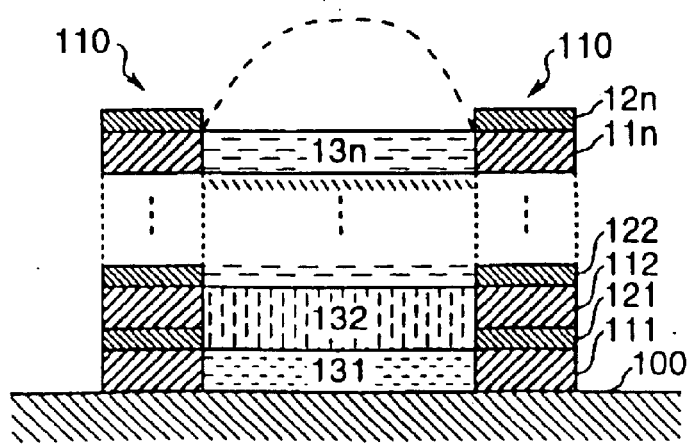

The amount of thin film material solution to be filled is adjusted by the thickness of the layer which is formed at the position corresponding to the thin film layer. In the case of the thin film layer 131 at the lowest layer, the amount of the thin film material solution is adjusted such that the thickness after the solvent component is evaporated from the thin film solution by a heat treatment becomes roughly the same as the thickness of the affinity bank layer 111 (broken line in FIG. 3B). For the thin film layers 132–13$n$ on the thin film layer 131, the amount of thin film material solution is adjusted such that the thickness after the solvent component is evaporated from the thin film material solution by a heat treatment becomes roughly the same as the total thickness of the non-affinity bank layer 12$x$ and the affinity bank layer 11$x$+1 formed at the corresponding position (FIGS. 3C and D).

A method for filling the thin film material solution is preferably an ink jet method. If an ink jet method is used, any amount of fluid can be filled to any position, and the fluid can be filled by such a small device as a device used for a home printer.

When the thin film material solution is filled by an ink jet method, the thin film material solution is heated to remove the solvent component. In order to eject a liquid from an ink jet type recording head, the viscosity normally must be several pc or less. Therefore an amount more than the amount required for the thickness of the final thin film layer is ejected.

Immediately after ejection, the thin film material solution contacts the affinity bank layer which is positioned higher than the final thickness. As the solvent component evaporates and the volume decreases by a heat treatment, the liquid level of the thin film material solution decreases while being pulled somewhat by the bank wall faces. When the liquid level comes to the non-affinity bank layer, the thin film material solution is repelled and the contact point between the thin film material solution and the wall faces shifts to the affinity bank layer, which is one layer below. In this way, the liquid level drops in steps, and when the volume of the thin film material solution decreases down to a level near the thickness of the final thin film layer, then the contact point between the liquid level of the thin film material solution and the wall faces shifts to the boundary between the affinity bank layer located at the lowest position of the bank layers which the thin film material solution is contacting, and the non-affinity bank layer immediately above the affinity bank layer.

The amount of the thin film material solution to be filled is set such that the volume of the thin film material solution after a heat treatment comes roughly to the total height of the non-affinity bank layer and the affinity bank layer located at the lowest layer when the thin film material solution is filled. After the liquid level shifts to the boundary between the affinity bank layer located at the lowest layer and the non-affinity bank layer immediately above the affinity bank layer, the liquid level no longer drops. The thickness at the center of the thin film material solution gradually drops by the decrease in volume, and when the thickness becomes the same in all the portions from the part contacting the bank wall faces to the center part, the thin film layer solidifies and completes.

In the thin film layer 131 at the lowest layer, for example, the thin film material solution 130 is ejected into the concave portion 101 enclosed with the banks 101 by the ink jet type recording head 102 up to the position shown by the broken line in FIG. 3B. Then the thin film material solution becomes a flat thin film layer 131 by a heat treatment. In the thin film layer 132 above the thin film layer 131, the thin film material solution 130 is ejected on the thin film layer 131 by the ink jet type recording head 102 up to the position shown by the broken line in FIG. 3C. Then the thin film material solution becomes a flat thin film layer 132 by a heat treatment. These processing steps are repeated until the thin film layer 13$n$ is formed.

The ink jet method may be a piezo-jet method or a method for ejecting by generating bubbles by heat, or a method for ejecting by electrostatic force. In the case of a piezo-jet method, the head is comprised of a nozzle and a piezoelectric element equipped in a pressure chamber. When voltage is applied to the piezoelectric element where fluid is filled in the pressure chamber, a volume change occurs in the pressure chamber and droplets of the fluid are ejected from the nozzle. In the case of a method for ejecting by generating bubbles, a heating element is disposed in a pressure chamber connected to the nozzle of the head. When the heating element is heated and fluid near the nozzle boils, bubbles are generated and the fluid is ejected by volume expansion. The piezo-jet method is preferable since the fluid is not affected by heating.

As mentioned above, in accordance with the first embodiment, each thin film layer can be formed flat.

Also in accordance with the first embodiment, plasma treatment is executed under the condition where oxygen is mixed with fluorine compound, therefore non-affinity of the bank surface, which is made of organic material, and affinity of the bank surface, which is made of inorganic material, and of the bank formation face for the thin film material solution can be adjusted.

Also in accordance with the first embodiment, the contact angle to implement a degree of affinity according to the characteristics shown in FIG. 4 can be easily set. That is, affinity between the banks and the bank formation face can be accurately controlled while maintaining high adhesion between the banks and the bank formation face without going through numerous steps for affinity control, which is conventionally required. As a result, an overflow of the thin film material solution from the banks can be prevented, yield can be improved, and manufacturing cost can be decreased.

(Second Embodiment)

Second embodiment of the present invention is layering banks in a method different from the above embodiment. In this embodiment, just like the above first embodiment, banks are formed in any shape on the bank formation face, and is applied to various applications where a predetermined fluid is filled in areas enclosed with banks. For example, this embodiment can be applied when organic semiconductor material is filled in pixel areas of a display device using an organic semiconductor thin film device, or when color resin is filled in pixel areas of a color filter.

FIG. 5 shows a cross-sectional view of manufacturing steps of the present embodiment.

Figure 5A:
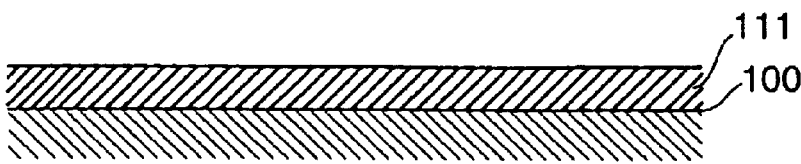
FIGS. 5A–5G are cross-sectional views of manufacturing steps of a thin film formation method in accordance with the second embodiment of the present invention.
Figure 5B:
Figure 5C:

Lower layer film formation step (FIGS. 5A–C)

Figure 5D:
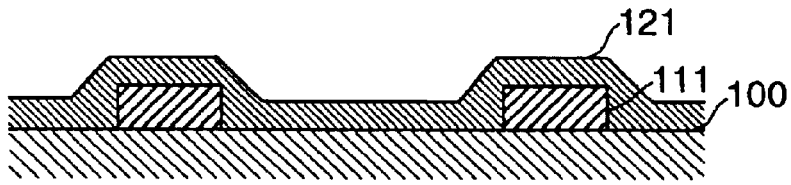
Figure 5E:
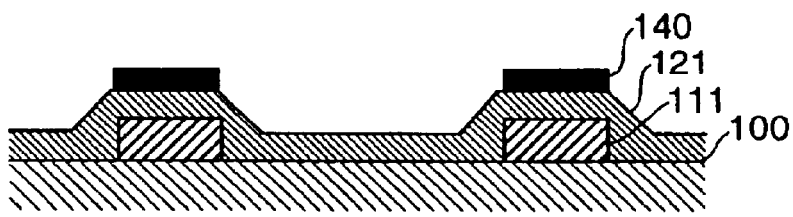
Figure 5F:

In the lower layer film formation step, the affinity bank layer 111 is formed on the bank formation face 100. At first, inorganic material is coated in the same method as the above first embodiment (FIG. 5A). Then a mask 140 is formed on the inorganic material layer matching the bank shape (FIG. 5B). Next the inorganic material layer is etched to remove inorganic material except for the area where the mask 140 is placed (FIG. 5C). The etching method is selected according to the characteristics of the material. In the case of an inorganic material, such as $SiO_2$, not only dry etching but also wet etching using such an etchant as hydroflouric acid (HF) can be used. In this way, the affinity bank layer 111 at the lowest layer is formed. Then an organic material is coated in the same method as in the above embodiment (FIG. 5D). Next a mask 142 is set on the organic material layer, matching the bank shape (FIG. 5E). Then the organic material layer is etched and the organic material is removed except for the area where the mask 141 is placed (FIG. 5F). The etching method is selected according to the characteristics of the material. In the case of an organic material, such as polyimide, not only dry etching but also wet etching using such an etchant as NMP (N-methyl pyrolidone) can be used.

Figure 5G:
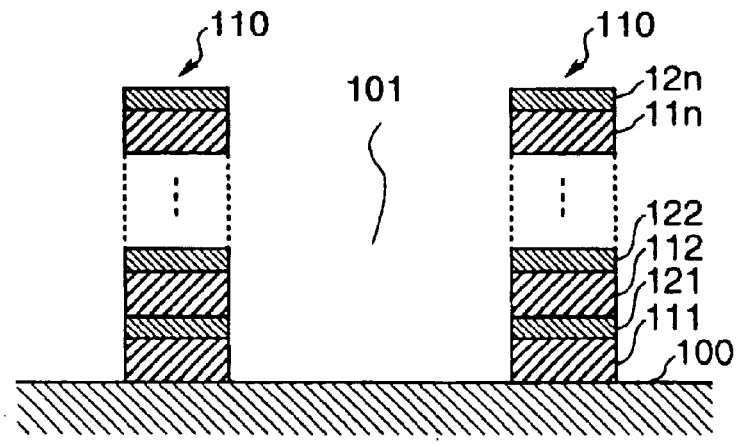

In this way, the non-affinity bank layer 121 is formed. Unlike the above first embodiment, in this embodiment, the affinity bank layer is not etched using the non-affinity bank layer as a mask, but each top layer can be independently etched, therefore the bank shape in the affinity bank layer and the bank shape in the non-affinity bank layer can be different. For example, it is possible to decrease the width of the bank as processing moves from lower to upper layers, to form a bank to be step shaped or taper shaped. If the banks are formed in this way, then the thin film material solution to be the thin film layer can be easily filled, and when the wiring pattern is formed over the banks, disconnection of the wiring can be prevented. By selecting an appropriate shape for the lower bank layer, an ideal thin film layer can be formed. Repeating the above steps (FIGS. 5A–F) for the required number of layering times (e.g. n times), the banks 110 are formed, as shown in FIG. 5G.

Descriptions on the surface treatment step and the thin film layer formation step are omitted since they are the same as in the first embodiment.

As described above, in accordance with the present second embodiment, not only are the same effects as in the first embodiment are implemented, but also an optimum shape of the thin film layer can be set for the application device, since the shape of each layer of the banks can be different.

EXAMPLES

The layer structure of examples when the above embodiment is applied will now be explained.

Figure 6:
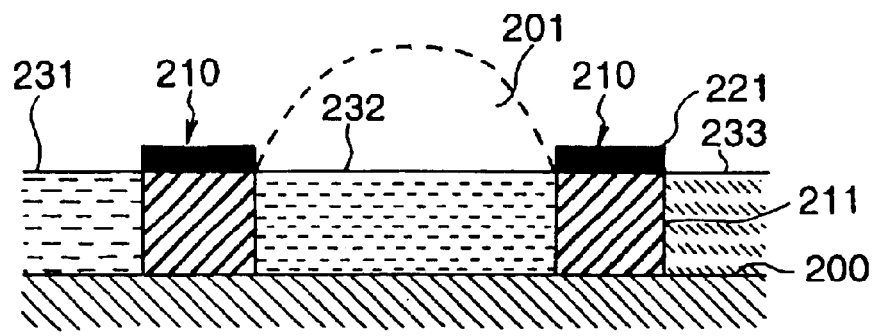
FIG. 6 is a cross-sectional view of an example when the present invention is applied to a color filter.

FIG. 6 is a cross-sectional view of an example when the present invention is applied to a color filter. In this color filter, the partition elements 210 are formed on a board 200 grid-like when viewed from the top, as shown in FIG. 6, and the color resins 231–233 are filled in the pixel areas 201 enclosed with the partition elements 210. The board 200 corresponds to the bank formation face of the present invention, and is comprised of transparent material having good adhesion with the color resins, such as glass, quartz and resin. The partition elements 210 correspond to the banks of the present invention, and a resin layer (or inorganic insulation film layer) 211 is formed as the affinity bank layer, and a black matrix layer 221 is formed as the non-affinity bank layer. The resin layer (or insulation film layer) 211 is formed by molding resin in bank shapes. The black matrix layer 221 is formed by coating an inorganic material or an organic insulation material containing carbon. The color resin layers 231 (red), 232 (green) and 233 (blue), correspond to the thin film layers of the present invention, and are formed by filling resin mixing dies of primary colors, such as red, green and blue, in each pixel area 201.

According to the above configuration, surface treatment is performed such that the resin layer (or insulation film layer) 211 has affinity for the color resin, and surface treatment is performed such that the black matrix layer 221 has non-affinity for the color resin. Therefore when the color resin is filled by the ink jet method and heat treatment is executed, the color resin layers 231–233 are formed to be flat. As a result, image display without uneven brightness and color can be implemented.

Figure 7:
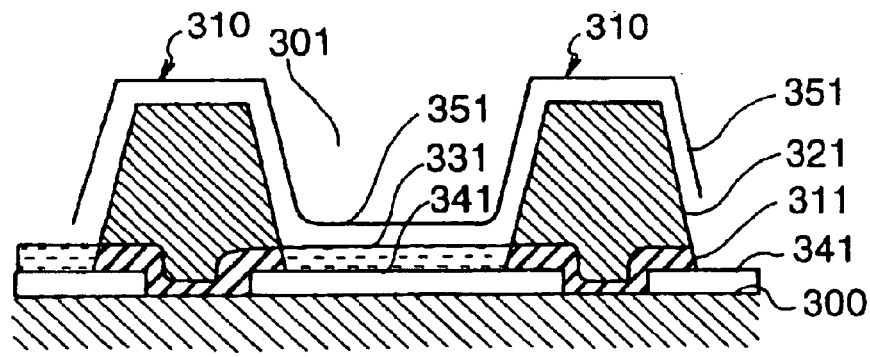
FIG. 7 is a cross-sectional view of an example when the present invention is applied to an organic semiconductor light emitting element of a display.

FIG. 7 is a cross-sectional view of a layer structure of an example when the present invention is applied to an organic semiconductor light emitting element of a display. As FIG. 7 shows, transparent electrodes 341 and banks 310 are formed on the drive board 300 in this organic semiconductor light emitting element, and the organic semiconductor layer 331 is formed in the concave portions 301 enclosed with the banks 310. The metal electrodes 351 are formed on the entire surface. In the drive board 300, multiple layers of TFT, wiring and insulation films are laminated, so that voltage can be applied between the transparent electrode 341 and the metal electrode 351. The transparent electrode 341 is formed by layering ITO, for example, to be 0.05 $\mu$m–0.2 $\mu$m, so as to transmit light from the organic semiconductor layer 331 and the reflected light from the metal electrode 351. The bank 310 is comprised of the bottom layer 311 and the top layer 321. The bottom layer 311 is comprised of an inorganic material having affinity for the organic semiconductor material, which is silicon oxide or silicon nitride, for example, formed by CVD, sputtering or various coating methods. The top layer 321 is comprised of an organic material having non-affinity for the organic semiconductor material, which is an organic compound containing polyimide, amorphous silicon, polysilicon, or fluorine, or insulating organic compound. The organic semiconductor layer 331 is comprised of a material which emits light when an electric field is applied, such as polyphnylene vinylene (PPV) or other known material, and is layered to be 0.05 $\mu$m–0.2 $\mu$m. The metal electrode 351 is comprised of aluminum-lithium (Al—Li) and is layered to be 0.1 $\mu$m–1.0 $\mu$m.

According to the above configuration, surface treatment is performed such that the bottom layer 311 has affinity for the organic semiconductor layer 331, and the top layer 321 has affinity for the organic semiconductor layer 331, therefore when the organic semiconductor material is filled by an ink jet method and heat treatment is executed, the organic semiconductor layer 331 is formed to be flat. As a result, image display without uneven brightness and color and without missing colors can be implemented. Electrode shorting is also prevented, which improves reliability of the display and extends life.

Figure 8:
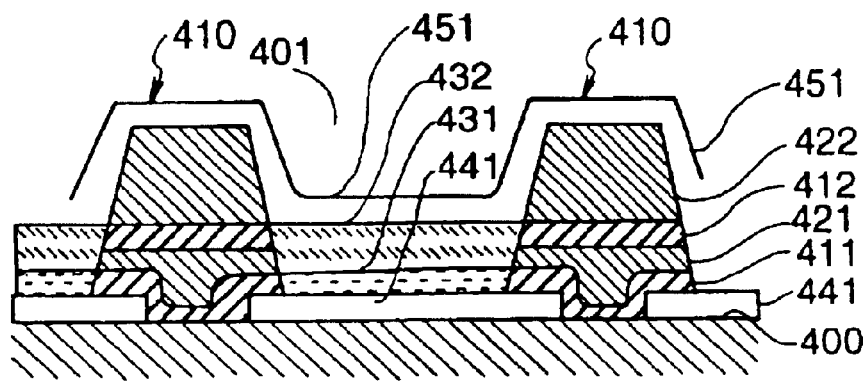
FIG. 8 is a cross-sectional view of another example when the present invention is applied to an organic semiconductor light emitting element of a display.
Figure 9A:
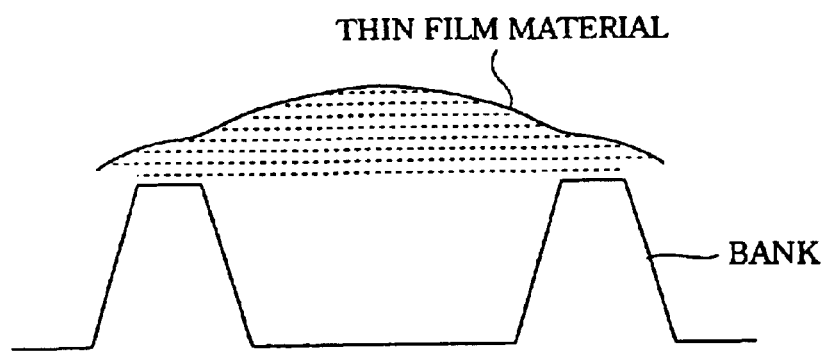
FIGS. 9A–9C are drawings depicting problems in conventional bank formation.
Figure 9B:
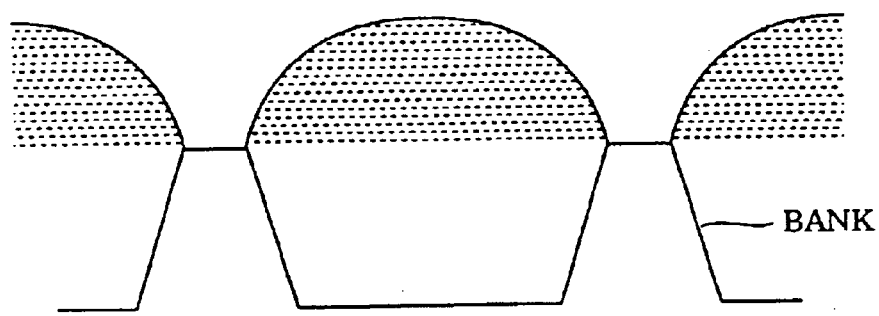
Figure 9C:
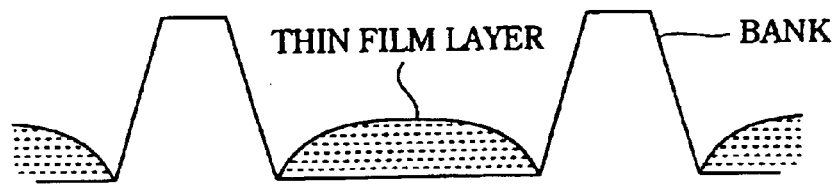
Figure 10A:
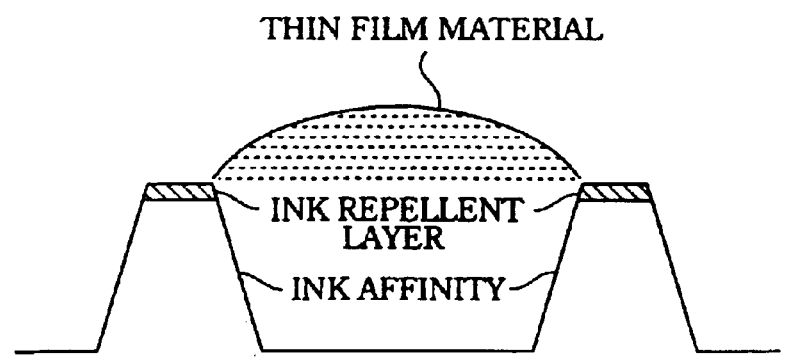
FIGS. 10A–10B are drawings depicting problems in conventional bank formation.
Figure 10B:
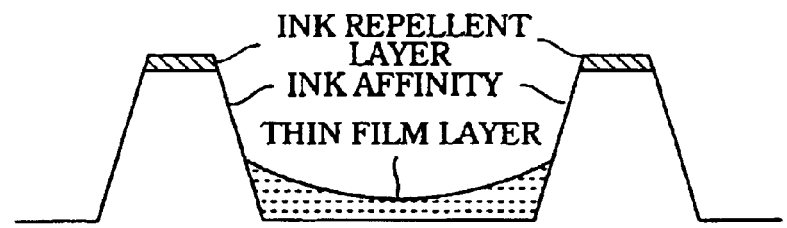

FIG. 8 is a cross-sectional view of the layer structure of another example when the present invention is applied to an organic semiconductor light emitting element of a display. As FIG. 8 shows, in this organic semiconductor light emitting element, transparent electrodes 441 and banks 410 are formed on the drive board 400, and the hole transporting layer 431 and the semiconductor layer 432 are layered in the concave portions 401 enclosed with the banks 410. The metal electrodes 451 are formed on the entire surface. The drive board 400, the transparent electrode 441, the organic semiconductor layer 432 and the metal electrode 451 are the same as the above example shown in FIG. 7. The bank 410 is comprised of affinity layers 411 and 412 and non-affinity layer 421 and 422 which are alternately layered. The affinity layer 411 is comprised of an inorganic material having affinity for the hole transporting material or the organic semiconductor material, which is silicon oxide or silicon nitride formed by CVD, sputtering or various coating methods. The non-affinity layer 421 is comprised of an organic material having non-affinity for the organic semiconductor material, which is an organic compound containing polyimide, amorphous silicon, polysilicon, or fluorine, or insulating organic compound. The hole transporting layer 431 is comprised of a material which can transport holes from the transparent electrode 441, which is an anode, to the organic semiconductor layer 432, which is an ITO mixing hole supply element, for example.

According to the above configuration, surface treatment is performed such that the affinity layer 411 has affinity for the hole transporting layer 431, and surface treatment is performed such that the affinity layer 412 has affinity for the organic semiconductor layer 432. Also surface treatment is performed such that the non-affinity layer 421 has non-affinity for the hole transporting layer 431 and the organic semiconductor layer 432. When the hole transporting layer 431 and the organic semiconductor layer 432 are filled by an ink jet method and heat treatment is executed, the respective layers are formed to be flat. As a result, image display without uneven brightness and color and without missing colors can be implemented. Electrode shorting is also prevented, which improves reliability of the display and extends life.

The structures of the color filter and organic electroluminescence device are not restricted by the above examples, but can be changed in various ways. For example, in the organic electroluminiscence device, the electron transporting layer and the other organic semiconductor layers may be layered.

(Variant Forms)

The present invention is not restricted by the above embodiments, but the present invention may be applied in yet other ways without departing from the essential features thereof.

For example, the affinity material, non-affinity material and the bank formation method using these materials can be modified in various ways without being restricted by the above embodiments. This is because an essential feature of the present invention is forming the thin film layers without distortion by arranging layers having different degrees of affinity alternately. For example, not only forming the banks by materials for forming banks which can form thick film, but the banks of the present invention may also be formed by coating a material having affinity or a material having non-affinity on the bank surface. For example, diethylene glycol methyl ethyl ether ($C_2H_5OCH_2CH_2CH_2OCH_2CH_2OCH_3$) or 2-fluoro octyl ethyl-acrylete ($FCF_{28}CH_2CH_2OOOCH=CH_2$) by itself represents non-affinity for a thin film material solution having polar group molecules.

The above surface treatment is not restricted to plasma treatment but any surface treatment method which can treat surfaces for different affinities under the same surface treatment conditions, as shown in FIG. 4, can be used. This is because an essential feature of the present invention is adjusting affinity by surface treatment. Therefore the materials for which affinity is set between is not restricted by an inorganic material and organic material, but the surface treatment of the present invention can be applied to specific materials between which affinity characteristics shown in FIG. 4 are exhibited.

The above banks are not restricted by layered affinity materials and non-affinity materials. For example, the configuration of the present invention can be formed such that a single element is formed first, then the area having affinity for the thin film material solution and an area having non-affinity for the thin film material solution are formed alternately. For example, it is possible to form the bank material with an affinity material, where non-affinity material is coated in stripes. For the non-affinity material, paraffin, for example, can be used rather than those materials of the above embodiments. It is also possible to form the bank material with a non-affinity material, where ultraviolet rays are irradiated in stripes to create affinity areas, or charges are removed in stripes and affinity material is coated utilizing charges. If a metal thin film is formed on the entire surface of the bank material, and is dipped into a sulfur compound having affinity substituents and a sulfur compound having non-affinity substituents sequentially from the bottom layer, then an affinity area and a non-affinity area can be formed in stripes by mono-molecular film.

INDUSTRIAL APPLICABILITY

In accordance with the thin film formation method of the present invention, thin film layers can be formed without distortion by layering different materials for banks. This improves performance and reliability of the device dramatically.

Also in accordance with the thin film formation method of the present invention, affinity of the thin film can be controlled so as to be layered by executing surface treatment under predetermined conditions, without going through numerous steps for affinity control. As a result, cost required for affinity control can be decreased, and films with uniform film thickness can be layered for the thin film.

In accordance with the display of the present invention, the thin film is layered by the thin film formation method which can form multi-layer thin film, therefore thin film layers with uniform thickness can be layered. As a result, image display without uneven brightness and color and without missing color can be implemented. Electrode shorting is also prevented, which improves reliability and extends life of the display.

In accordance with the color filter of the present invention, the thin film is layered by the thin film formation method which can form multi-layer thin film. Therefore thin film layers with uniform thickness can be layered. As a result, an image display without uneven brightness and color can be implemented.

What is claimed is:

1. A method for forming a thin film layer by arranging a thin film material solution in areas enclosed with banks, comprising steps of:

(a) forming the banks on a bank formation face so as to enclose the areas therewith; and (b) filling the thin film material solution within the areas, (c) wherein the step (a) comprises forming the banks where an affinity banks layer and a non-affinity bank layer are alternately layered, by repeating at least one of the steps of forming the affinity bank layer with a material having affinity for the thin film material solution, and of forming the non-affinity bank layer with a material having a non-affinity for the thin film material solution one or more times.

2. The method according to claim 1, further comprising:

(c) carrying out a predetermined surface treatment for the banks and bank formation face after step (a).

3. The method according to claim 2, wherein in the step (c), the surface treatment is carried out under a predetermined condition such that a degree of non-affinity for the thin film material solution is higher in the non-affinity bank layer than in the affinity bank layer.

4. The method according to claim 3, wherein in the step (c), the surface treatment is carried out under a predetermined condition such that the affinity of the affinity bank layer for the thin film material solution is the same or less than the affinity of the bank formation face within the area enclosed the banks for the thin film material solution.

5. The method according to claim 4, wherein the predetermined condition is that a content of the fluorine compound in a total amount of fluorine compound and oxygen is set to be 60% or more.

6. The method according to claim 3, wherein the predetermined condition is that an amount of the fluorine compound is more than that of oxygen.

7. The method according to claim 2, wherein the surface treatment is a plasma treatment which irradiates plasma under an atmosphere containing oxygen using a gas containing fluorine or fluorine compound as the introductory gas.

8. The method according to claim 7, wherein the gas containing fluorine comprises a halogen gas which is selected from the group consisting of $CE_4$, $SF_6$ and $CHF_3$.

9. The method according to claim 2, wherein the surface treatment is carried out such that a contact angle of the affinity bank layer surface to the thin film material solution is 30 degrees or less.

10. The method according to claim 2, wherein the contact angle of the non-affinity bank layer surface to the thin material solution is 40 degrees or more.

11. The method according to claim 1, wherein the step (a) comprises forming a set of affinity bank layer and non-affinity bank layer by an affinity bank layer formation step of forming the affinity film with the affinity material, a non-affinity bank layer step of forming non-affinity bank layer with a non-affinity material on the affinity bank layer matching the bank formation face within the enclosed area, and removing the affinity bank layer in the area where the non-affinity bank layer is not formed by etching using the non-affinity bank layer as a mask.

12. The method according to claim 11, wherein the the non-affinity bank layer is formed with a photosensitive material.

13. The method according to claim 1, wherein the step (a) comprises forming a set of affinity bank layer and non-affinity bank layer forming the affinity bank layer with the affinity material, etching the affinity bank layer along with the bank formation area in the lower layer, forming non-affinity bank layer with a non-affinity material covering the affinity bank layer, and etching non-affinity bank layer along with the bank formation area in the upper layer.

14. The method according to claim 13, wherein the non-affinity bank layer is formed with a photosensitive material.

15. The method according to claim 1, wherein the affinity material is an inorganic material and the non-affinity material is an organic material.

16. The method according to claim 1, wherein the non-affinity material is selected from the group consisting of polymide, amorphous silicon, polysilicon an organic compound containing fluorine and an insulating organic compound.

17. The method according to claim 1, wherein the affinity material is selected from the group consisting of aluminum, tantalum, silicon oxide and silicon nitride.

18. The method according to claim 1, wherein the thin film layer comprises a multi-layered thin film and a thickness of a thin film layer at the lowest layer is set to a thickness roughly the same as the affinity bank layer at the lowest layer of the bank.

19. The method according to claim 1, wherein the thin film layer comprises a multi-layered thin film and a thickness of each thin film layer which is layered on the lowest layer is set to a thickness roughly the same as the respective total thickness of the affinity bank layer and the non-affinity bank layer which are layered to the height corresponding to the bank.

20. The method according to claim 1, wherein the step of forming the non-affinity bank layer and forming the affinity bank layer in the step (a) is a step of forming respective bank layers by coating a predetermined material dissolved in a solvent, and the non-affinity bank layer is formed by coating the material of the non-affinity bank layer before removing the solvent where the material of the affinity bank layer is dissolved.

21. The method according to claim 1, wherein both of the steps of forming the affinity bank layer, and of forming the non-affinity bank layer with a material having a non-affinity for the thin film material solution, are repeated one or more times.

22. A display comprising:
a plurality of banks;
a thin film layer being formed by filling a thin film material solution in area enclosed with banks; and
a pixel electrode made of ITO, the electrode being disposed in the area enclosed with banks,
wherein each bank comprises alternatively layered affinity bank layer having affinity for the thin film material solution and non-affinity bank layer having non-affinity for the thin film material solution, and the thin film layer is formed with an organic semiconductor material for forming a thin film light emitting element.

23. The display according to claim 22, wherein the affinity bank layer and/or the non-affinity bank layer are surface-treated so as to have affinity or non-affinity, respectively.

24. A thin film device comprising:
banks enclosing an area;
a thin film layer arranged in the area and being formed from solution of thin film material,
the banks comprising:
a plurality of affinity bank layers which have affinity for the thin film material solution; and
a non-affinity bank layer which has non-affinity for the thin film material solution,
the plurality of affinity bank layers sandwich the non-affinity layers such that the affinity bank layers and the non-affinity bank layer are alternatively layered to form the banks.

25. A thin film device according to claim 24, further comprising a plurality of the non-affinity bank layers.

* * * * *